United States Patent
Ismail et al.

(10) Patent No.: US 7,546,110 B2
(45) Date of Patent: Jun. 9, 2009

(54) LOW POWER HIGHLY LINEAR RF DOWNCONVERTER

(75) Inventors: Aly Ismail, Irvine, CA (US); Edward Youssoufian, Irvine, CA (US); Hassan Elwan, Lake Forest, CA (US); Frank Carr, New Coast, CA (US)

(73) Assignee: Newport Media, Inc., Lake Forest, CA (US)

( * ) Notice: Subject to any disclaimer, the term of this patent is extended or adjusted under 35 U.S.C. 154(b) by 511 days.

(21) Appl. No.: 11/378,558

(22) Filed: Mar. 17, 2006

(65) Prior Publication Data

US 2007/0218857 A1    Sep. 20, 2007

(51) Int. Cl.
*H04B 1/26* (2006.01)
*H04Q 1/26* (2006.01)

(52) U.S. Cl. .................... 455/323; 455/306; 455/307

(58) Field of Classification Search ........... 455/303, 455/306, 307, 313, 323, 324, 326
See application file for complete search history.

(56) References Cited

U.S. PATENT DOCUMENTS

2003/0087624 A1* 5/2003 Leenaerts ............... 455/323
2005/0107064 A1* 5/2005 Ismail .................... 455/339
2006/0068749 A1* 3/2006 Ismail et al. ............ 455/339

OTHER PUBLICATIONS

Zhou et al., "A CMOS Passive Mixer With Low Flicker Noise For Low-Power Direct Conversion Receiver," IEEE Journal of Solid-State Circuits, vol. 40, No. 5, May 2005, pp. 1084-1093.

* cited by examiner

*Primary Examiner*—Lee Nguyen
(74) *Attorney, Agent, or Firm*—Rahman LLC

(57) ABSTRACT

A technique for downconverting a RF signal comprises an antenna adapted to receive an RF signal; a transconductance amplifier connected to the antenna and adapted to amplify the RF signal; a passive mixer connected to the transconductance amplifier and adapted for current domain mixing of electrical current transferred from the transconductance amplifier; and a load impedance connected to the passive mixer. The load impedance may comprise a parallel combination of a frequency dependent negative resistance component, a capacitor, and a resistor. The load impedance may comprise a pair of complex poles, a pair of imaginary zeros, and a real pole. Voltages at an input and an output of the passive mixer are related such that the input voltage of the passive mixer is an upconverted version of the output voltage of the passive mixer, wherein the input voltage of the passive mixer is at an output of the transconductance amplifier.

21 Claims, 7 Drawing Sheets

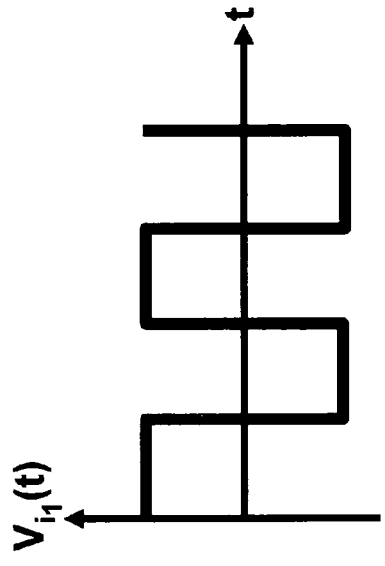
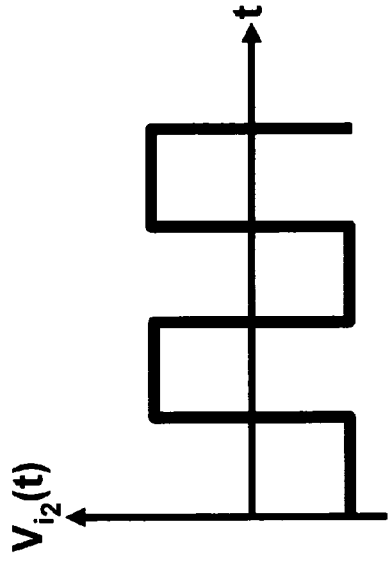
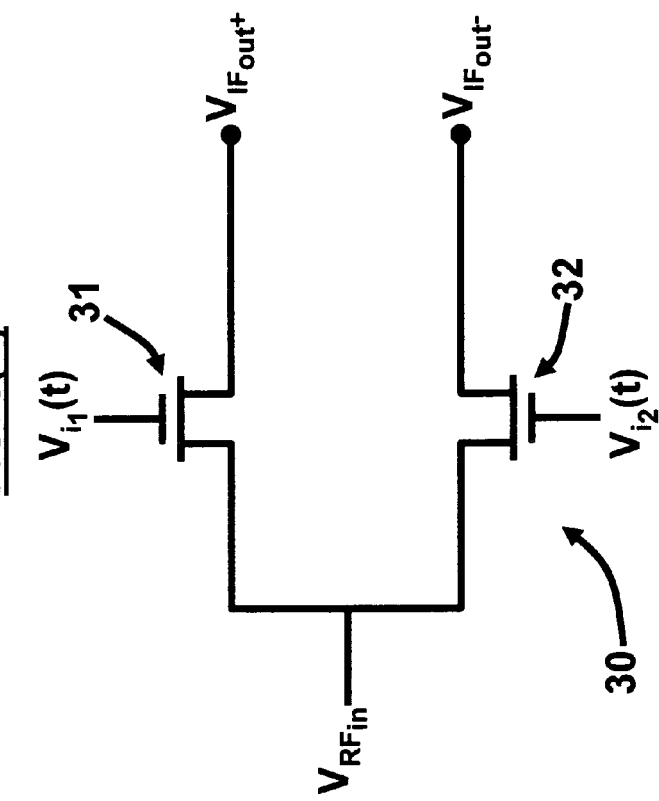

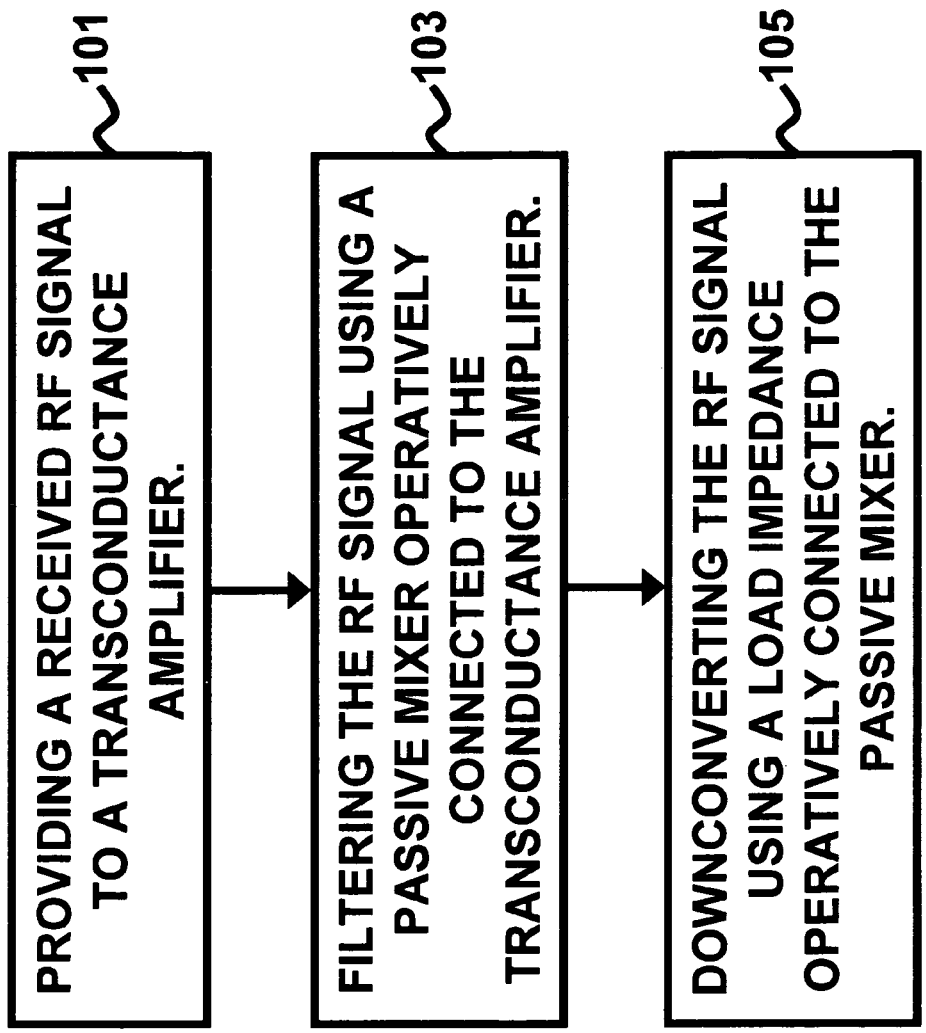

LOW POWER HIGHLY LINEAR RF DOWNCONVERTER

BACKGROUND

1. Technical Field

The embodiments herein generally relate to radio frequency (RF) technologies, and, more particularly, to RF downconverters used with complementary metal oxide semiconductor (CMOS) technologies.

2. Description of the Related Art

Achieving a low cost RF solution generally mandates the use of a direct conversion architecture, such as the one illustrated in FIG. 1, to eliminate the image reject RF surface acoustic wave (SAW) and the intermediate frequency (IF) SAW. In this case, with the use of relatively inexpensive and non-complex silicon technologies such as CMOS, the design of a high linearity RF downconversion mixer becomes very difficult in the existence of large adjacent blocking signals in addition to the sensitivity problems occurring due to flicker noise upconversion. Moreover, achieving a low cost highly linear low noise front-end generally becomes very difficult in a power conscious environment such as wireless receivers.

In other words, achieving highly linear RF downconverters in technologies such as CMOS is generally quite challenging for low power applications. One major challenge is the noise level degradation due to the flicker noise of the CMOS mixer. To solve this problem, CMOS passive mixers 4 are often used in a RF system 1 since they contribute much less flicker noise because their DC current is equal to zero. The RF system 1 shown in FIG. 1 further includes an antenna 2 adapted to feed RF signals into a low noise amplifier (LNA) 3 and a pair of low pass filters 5 connected to the CMOS passive mixers 4. However, the use of CMOS passive mixers 4 typically results in extra challenges. A regular CMOS mixer typically switches the RF signal in the voltage domain across a low frequency impedance (typically resistive).

In order to achieve a proper operation, two RF buffers 16, 17 may be used after the LNA 13 and prior to the mixers 14 as shown in the RF system 11 of FIG. 2. Generally, the role of these buffers 16, 17 are: (1) splitting the signal to the in-phase (I) and quadrature (Q) paths; (2) providing a well-defined RF equivalent low impedance voltage reference prior to the passive mixer (i.e., the output resistance of the buffer should be very low). Preferably, the buffers 16, 17 have a very wide dynamic range. In other words, its noise preferably is very low and its linearity should be very high given that it comes after the high gain LNA 13. Similar to the RF system 1 of FIG. 1, the RF system 11 of FIG. 2 further includes an antenna 12 and a pair of low pass filters 15.

Generally, all of the above requirements translate to very high power consumption in the RF buffers 16, 17. To achieve a performance comparable to its expensive bipolar-based technologies counterparts, the CMOS front-end will tend to consume a very high current. Accordingly, a clear disadvantage of the conventional solutions is very high current consumption. Wideband RF LNAs are typically required in advanced RF applications. However, the use of wideband resistive feedback amplifiers tend to result in a poor noise figure (NF). As such, other techniques should be investigated.

SUMMARY

In view of the foregoing, an embodiment herein provides an electrical circuit for downconverting a RF signal, wherein the electrical circuit comprises at least one transconductance amplifier; a passive mixer operatively connected to the at least one transconductance amplifier, the passive mixer being adapted for current domain mixing of electrical current transferred from the at least one transconductance amplifier; and a pair of second-order complex load impedances operatively connected to the passive mixer. The pair of second-order complex load impedances may comprise a parallel combination of a frequency dependent negative resistance (FDNR) component, a capacitor, and a resistor. The pair of second-order complex load impedances may comprise a pair of complex poles, a pair of imaginary zeros, and a real pole. Preferably, the FDNR comprises a general impedance converter (GIC). Moreover, voltages at an input and an output of the passive mixer are preferably related such that the input voltage of the passive mixer is an upconverted version of the output voltage of the passive mixer, wherein the input voltage of the passive mixer is preferably at an output of the transconductance amplifiers. The pair of second-order complex load impedances may comprise a pair of operational amplifiers; and at least one capacitance adapted to reduce noise generated by the pair of operational amplifiers.

Another embodiment provides a RF system for downconverting a RF signal, wherein the RF system comprises an antenna adapted to receive an RF signal; a transconductance amplifier operatively connected to the antenna, the transconductance amplifier being adapted to amplify the RF signal; a passive mixer operatively connected to the transconductance amplifier, the passive mixer being adapted for current domain mixing of electrical current transferred from the transconductance amplifier; and a load impedance operatively connected to the passive mixer. The load impedance may comprise a parallel combination of a FDNR component, a capacitor, and a resistor. The load impedance may comprise a pair of complex poles, a pair of imaginary zeros, and a real pole. Preferably, the FDNR comprises a GIC. Preferably, voltages at an input and an output of the passive mixer are related such that the input voltage of the passive mixer is an upconverted version of the output voltage of the passive mixer, wherein the input voltage of the passive mixer is preferably at an output of the transconductance amplifier. Preferably, the load impedance comprises a pair of operational amplifiers; and at least one capacitance adapted to reduce noise generated by the pair of operational amplifiers.

Another embodiment provides a method of downconverting a RF signal, wherein the method comprises providing a received RF signal to a transconductance amplifier; filtering the RF signal using a passive mixer operatively connected to the transconductance amplifier; and downconverting the RF signal using a load impedance operatively connected to the passive mixer. The method may further comprise configuring the load impedance with a parallel combination of a FDNR component, a capacitor, and a resistor. The method may further comprise configuring the load impedance with a pair of complex poles, a pair of imaginary zeros, and a real pole. Preferably, the FDNR comprises a GIC. The voltages at an input and an output of the passive mixer are preferably related such that the input voltage of the passive mixer is an upconverted version of the output voltage of the passive mixer, wherein the input voltage of the passive mixer is preferably at an output of the transconductance amplifier. The method may further comprise configuring the load impedance with a pair of operational amplifiers; and at least one capacitance adapted to reduce noise generated by the pair of operational amplifiers.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 3(A) illustrates a schematic diagram of a circuit according to an embodiment herein;

FIGS. 3(B) and 3(C) illustrate a graphical illustration of the voltage output according to the circuit of FIG. 3(A) according to an embodiment herein;

FIG. 8 is a flow diagram illustrating a preferred method according to an embodiment herein.

DETAILED DESCRIPTION OF PREFERRED EMBODIMENTS

Figure 1:
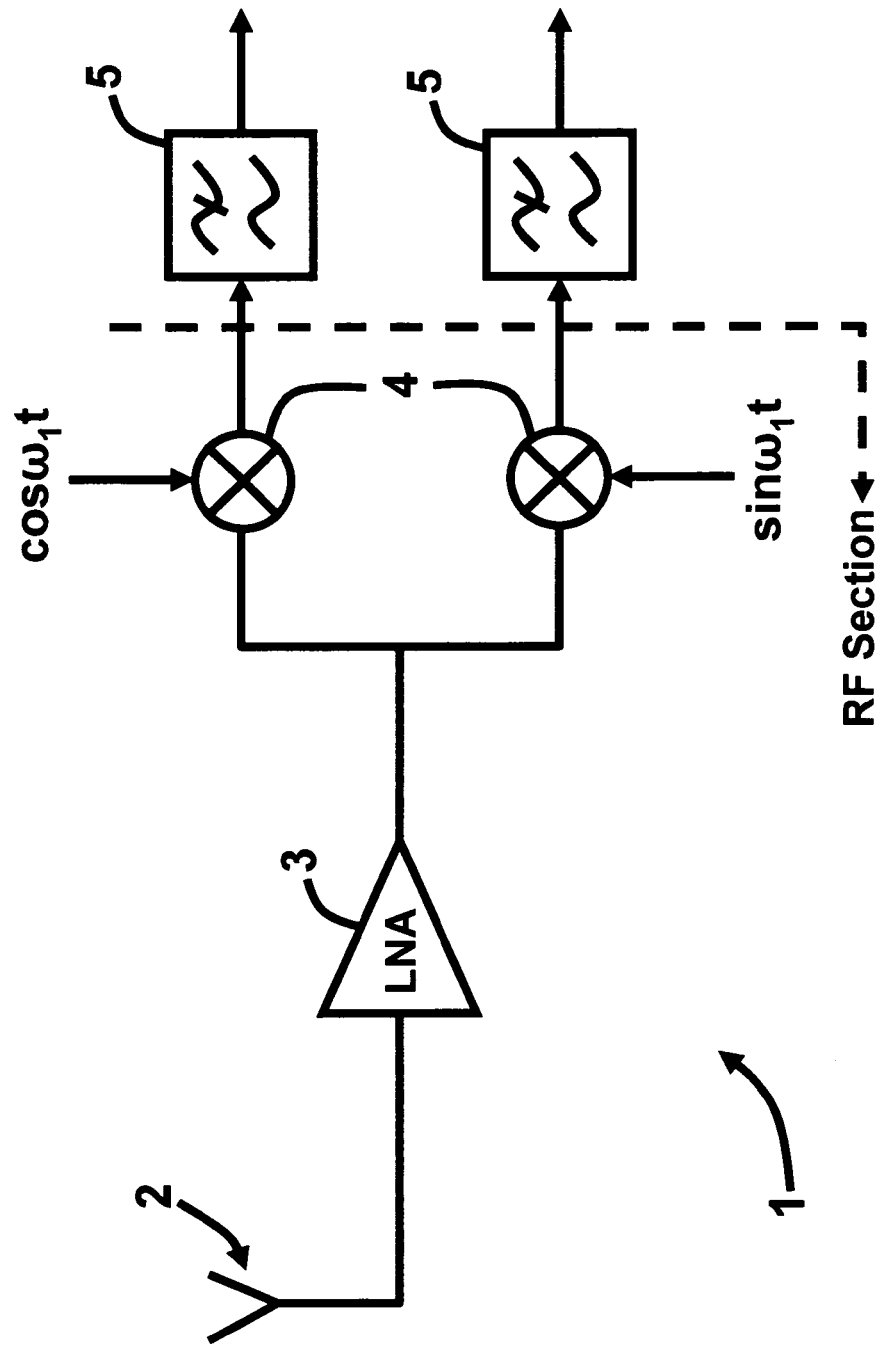
FIGS. 1 and 2 illustrate schematic diagrams of conventional circuits.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, the use of wideband resistive feedback amplifiers tends to result in a poor noise figure (NF). As such, there remains a need for other techniques for downconverting a RF signal. The embodiments herein achieve this by providing a new low noise highly linear RF downconversion mixer for a low power wireless receiver. An example of a low-noise filter for a wireless receiver is described in United States Patent Application Publication No. 2005/0107064 entitled "Low-Noise Filter for a Wireless Receiver," the complete disclosure of which, in its entirety is herein incorporated by reference. Referring now to the drawings, and more particularly to FIGS. 3(A) through 8, where similar reference characters denote corresponding features consistently throughout the figures, there are shown preferred embodiments.

As shown in FIG. 3(A), a RF signal is commutated in the voltage domain of the MOS transistors 31, 32. The two transistors 31, 32, which operate as a voltage-domain passive mixer 30, function as a single-ended to differential downconverter. The driving voltage waveforms to the passive mixer 30, $Vi_1(t)$ and $Vi_2(t)$, are antiphase square waveforms at the local oscillator frequency as illustrated in FIGS. 3(B) and 3(C), respectively. The passive mixer 30 offers excellent linearity yet transistors 31, 32 are preferably required to always operate in the triode region for proper operation. That sets an upper bound to the obtained linearity and makes it more challenging to achieve a high linearity level with limited supply headroom.

By providing some channel select filtering, the mixer 30 provided by the embodiments herein achieves superior linearity as compared to the conventional approaches. The embodiments herein have the additional advantage when implemented in advanced CMOS technology of low flicker noise upconversion. The circuit architecture provided by the embodiments herein is shown in FIG. 4.

Figure 4:
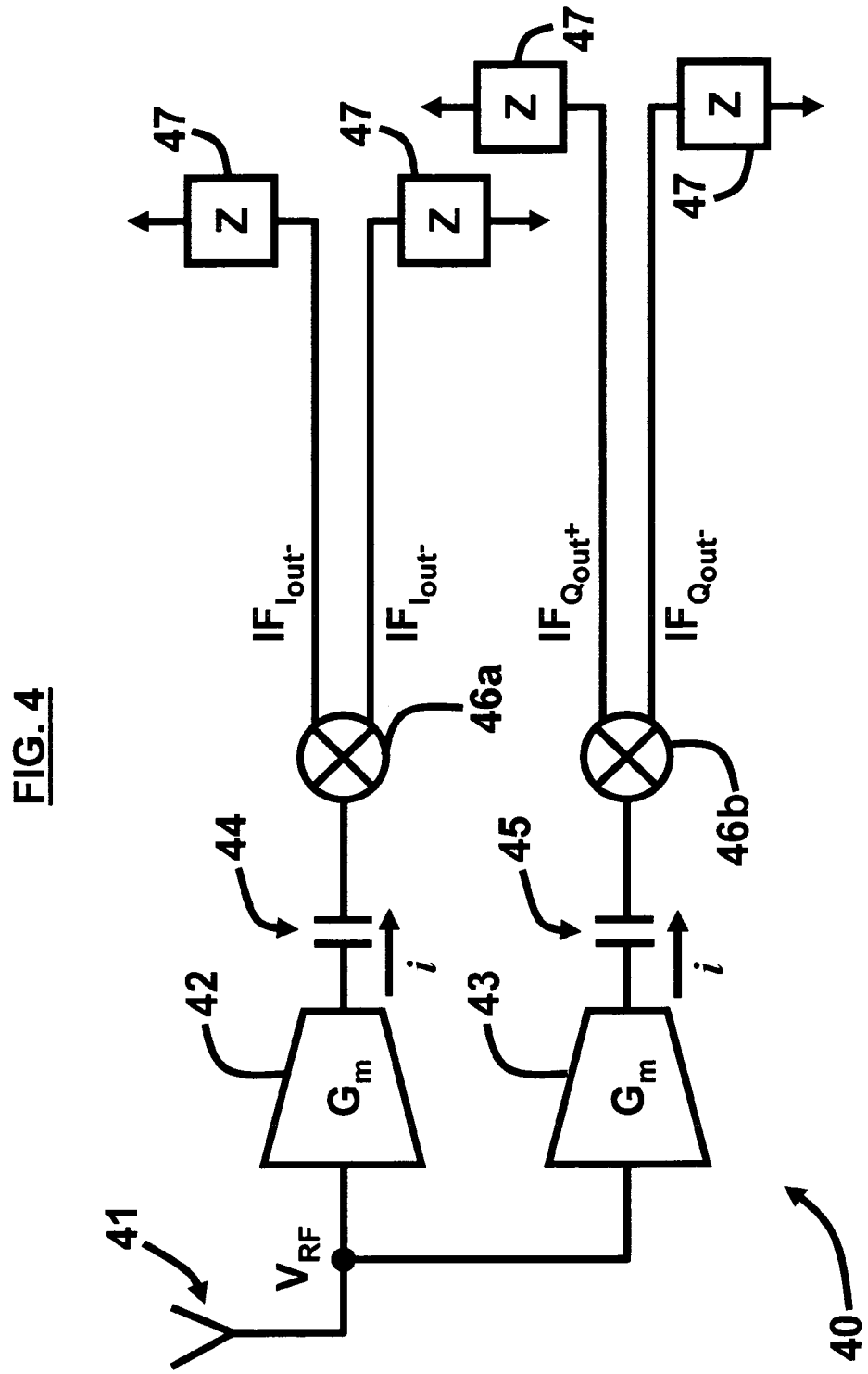
FIGS. 4 through 6 illustrate schematic diagrams of circuits according to an embodiment herein.

In FIG. 4, the antenna 41 captures a RF signal. The RF signal at the output of the LNA (not shown) is injected to the I and Q transconductors ($G_m$) 42, 43 respectively. The output currents from the two transconductors 42, 43 are fed in the current domain via coupling capacitors 44, 45 to the two passive mixers 46a, 46b before they are injected to the output loads 47. The passive mixers 46a, 46b achieve a current-domain mixing operation and deliver downconverted current signals to the load impedances 47 (Z). The output voltage levels at $IF_{Iout+}$, $IF_{Iout-}$, $IF_{Qout+}$, $IF_{Qout}$ are determined by the products of the downconverted current signals times the impedance Z. By choosing the appropriate complex impedance Z, the voltage swing at the output nodes may be kept moderate by providing sufficient filtering for out-of-band blockers. The voltage at the output of the transconductors stages 42, 43 are simply an upconverted version of the voltage across the impedance Z. As a result, the voltage swing across the passive mixers 46a, 46b is sufficiently low and achieves high linearity levels while realizing high voltage gains, as opposed to the voltage-mode passive mixer 30 shown in FIG. 3. The approach shown in FIG. 4 allows one to realize a voltage gain more than unity while achieving high linearity levels as the blockers are filtered via the complex load Z. The correct choice of the impedance Z, which is a design constraint, is significant to achieve the correct filtering and hence achieving higher voltage gain and linearity.

In the circuit 40, the current, i, coming out of the transconductance amplifiers 42, 43 (also depicted as $G_m$ in FIG. 4) is folded in the current domain into a CMOS passive mixer 46a, 46b. The use of a passive mixer 46a, 46b eliminates the flicker noise corruption of the signal and hence improves the resulting noise figure (NF). The current domain mixing eliminates the need of voltage mode buffers and hence simplifies the circuit 40. An example of a CMOS passive mixer that may be used is described in Zhou, S. et al., "A CMOS Passive Mixer With Low Flicker Noise for Low-Power Direct-Conversion Receiver," IEEE Journal of Solid-State Circuits, Vol. 40, No. 5, May 2005, the complete disclosure of which, in its entirety, is herein incorporated by reference. The load capacitances 44, 45 are used to perform an impedance inversion on a signal and transform the inductance to a capacitance.

Figure 5:
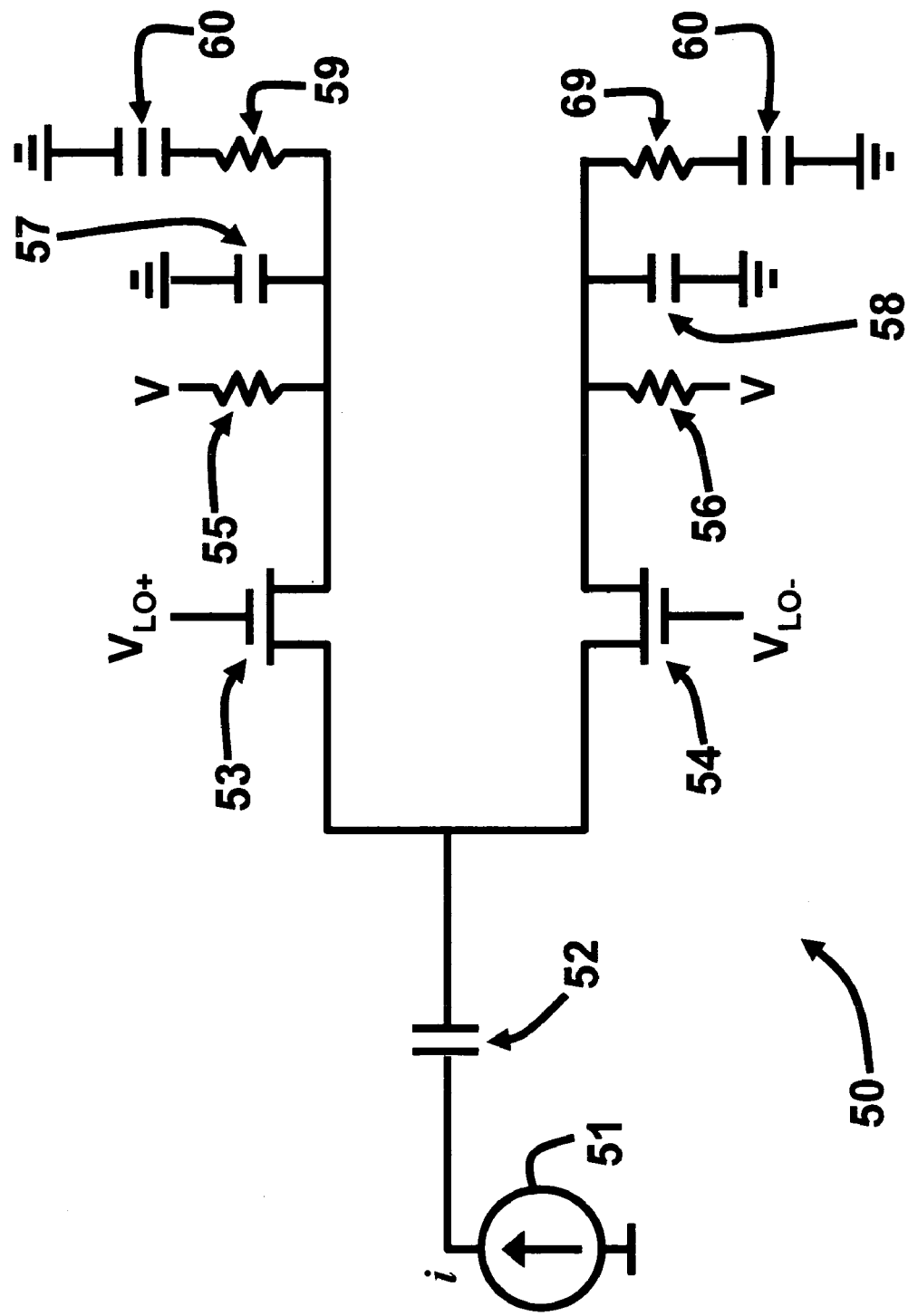

The load impedances 47 (Z) at the output of the passive mixer 46a, 46b play a major role in the linearity improvement in the topology. The load impedance, Z, should preferably be implemented as a second-order complex impedance. This impedance is realized through the parallel combination of a frequency dependent negative resistor (FDNR) 60, a capacitor 57, 58, and a resistor 55, 56 as shown in FIG. 5. The FDNR is further illustrated in FIG. 6. The FDNR is preferably implemented as a general impedance converter (GIC). The GIC based implementation of the FDNR is used to implement a bi-quad filter section. The GIC based implementation of the FDNR comprises a pair of operational amplifiers 61, 62 operatively connected to resistors and capacitors further described below. This complex impedance realizes a filter constellation that includes a pair of complex poles: a pair of imaginary zeros and a real pole. The resulting filter characteristic approximates a third order elliptic filter response. Due to the realization of the complex impedance using a GIC, the circuit 50 is flicker-noise free and contributes minimum noise in the signal path.

FIG. 5 shows the resulting mixer topology 50. The mixer transconductor stage 51 injects a signal in the current domain to the mixer switches 53, 54 via an alternating current (AC) coupling capacitor 52. The current, i, is commutated through the mixer switches 53, 54 and injects in the output differential load. The mixer load comprises a parallel combination of resistors 55, 56; capacitors 57, 58; and a series branch-comprising resistors 59, 69 and FDNR 60. The complex impedance at the mixer differential output lowers the voltage swing at both the input and output of the mixer switches 53, 54 resulting in a superior linearity compared to conventional passive mixers.

Figure 6:
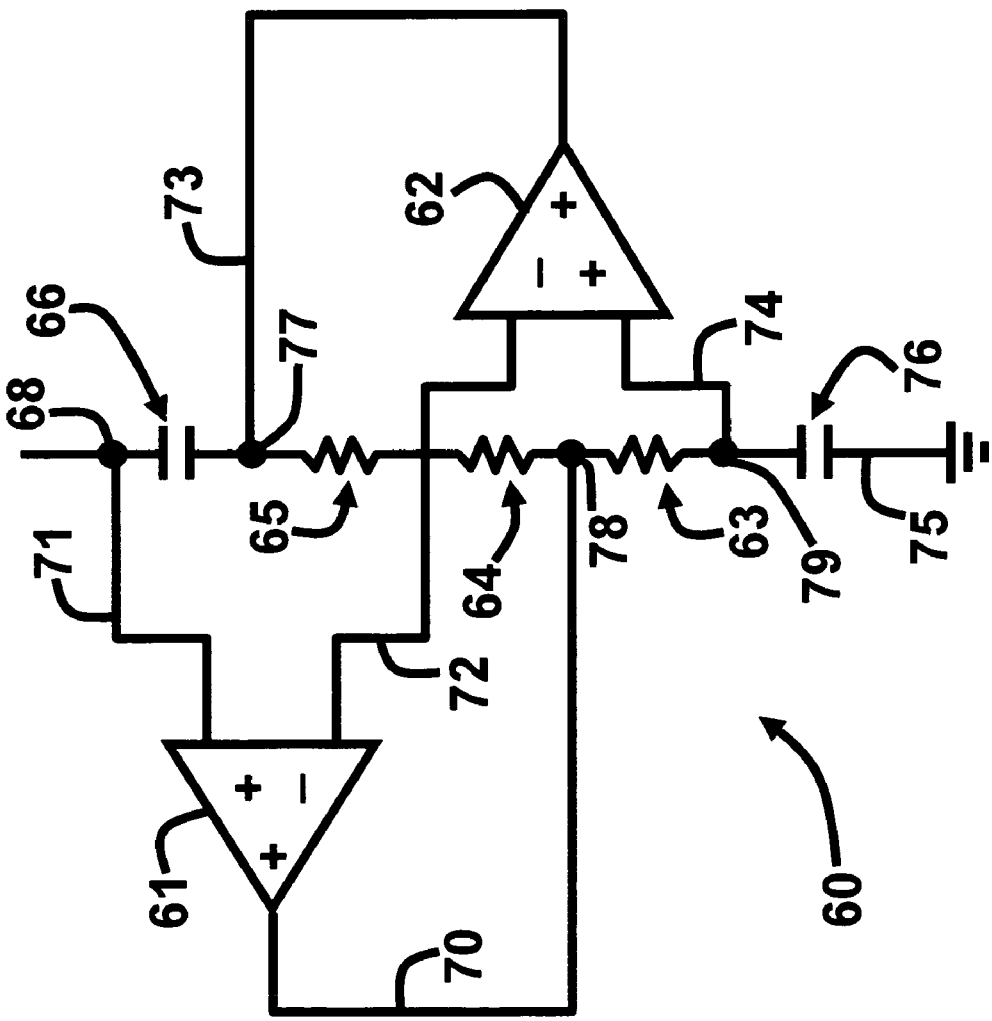

FIG. 6 depicts an active realization on the FDNR 60 using a GIC. The circuit 60 realizes an active impedance that rolls off at 40 dB/decade versus frequency. The GIC based implementation of the FDNR 60 includes a pair of operational amplifiers 61, 62, and related capacitances and resistances. The non-inverting input of the operational amplifier 61 is coupled via connection 71 to the node 68 between the operational amplifier 61 and capacitance 66, while the inverting input of the operational amplifier 61 is coupled via connection 72 to the inverting input of the operational amplifier 62. The non-inverting input of the operational amplifier 62 is coupled to the node 79 between the capacitance 76 and the resistance 63. The output of the operational amplifier 61 is coupled via connection 70 to the node 78 between the resistances 63, 64. The output of the operational amplifier 62 is coupled via connection 73 to the node 77 between the capacitance 66 and the resistance 65. Alternatively, the location of the resistance 64 and the capacitance 76 may be reversed.

Figure 7:
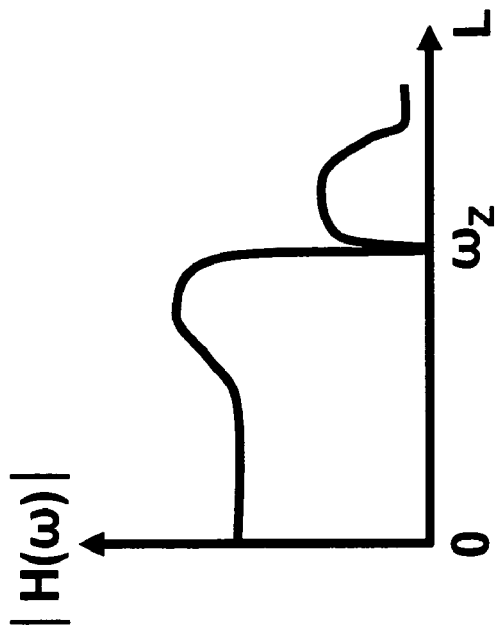
FIG. 7 illustrates a graphical illustration of the transfer function according to the circuit of FIG. 6 according to an embodiment herein.

FIG. 7 shows the frequency response of the complex impedance comprising a parallel resistor 55, 56, capacitor 57, 58, and FDNR 60 (of FIG. 5). This complex impedance realizes a pair of complex poles, a pair of imaginary zeroes, and a real pole. The frequency response is substantially approximate to a third order elliptic response with a deep notch at ωz. In other words, if one were to look at the frequency response there is a null or zero at the frequency ωz. The realized filtering characteristic provided by the embodiments herein strongly attenuates the blockers hence achieving more gain and higher linearity than conventional techniques.

One unique feature of the embodiments herein is that due to the current mode mixing via a passive mixer 46a, 46b, the voltages at the input and the output of the mixer 46a, 46b are related. More precisely, due to the feedback action, the voltage at the input of the mixer 46a, 46b is an upconverted version of the output voltage. Therefore, the voltage at the input of the mixer 46a, 46b which is also at the output of the I and Q transconductors, $G_m$, is an upconverted version of the output voltage of the mixer 46a, 46b. Now, since the output of the mixer 46a, 46b sees an equivalent third order elliptic filter due to the complex output load, the voltage at the output of the transconductor stages 42, 43, $G_m$, sees a similar yet upconverted version of it. This means that the voltage at this node is free of blockers which otherwise will increase the voltage swing at this node and degrade the linearity of the transconductors 42, 43, $G_m$, and the passive mixer 46a, 46b. Compared to the conventional topology, the circuit architecture provided by the embodiments herein has less blocking signals swinging at the main critical nodes and hence has much superior linearity at a much lower current consumption.

Figure 2:
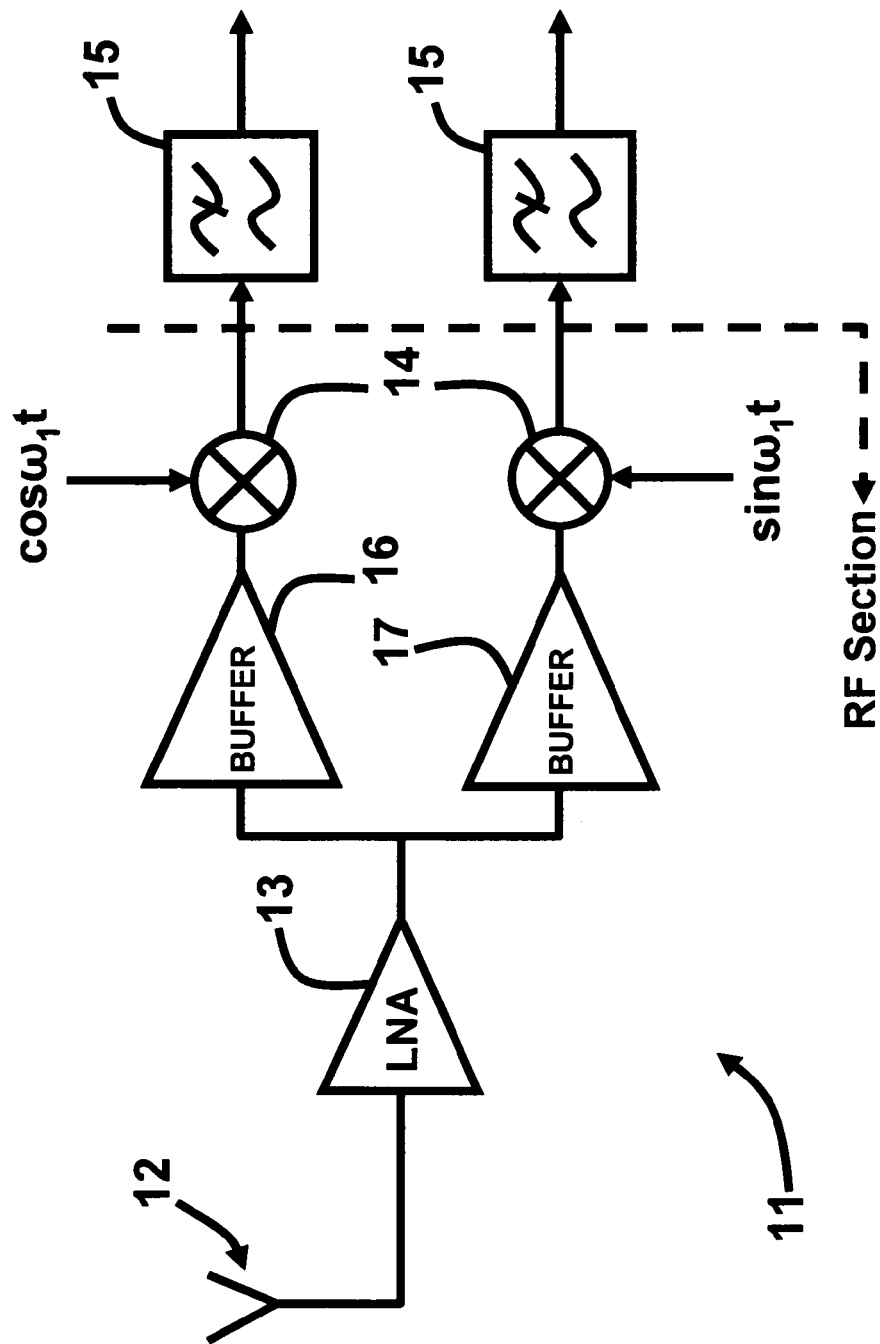

Generally, the embodiments herein eliminate the need for buffers. This topology realizes that the LNA prior to the mixer comprises a transconductance 42, 43, $G_m$, feeding a load impedance (resistive or tank), Z. The LNA may include one or two transconductor stages 42, 43, $G_m$, but feeds the signal in the current domain to the passive mixer 46a, 46b. To split the signal into I and Q paths, the passive mixer 46a, 46b (of FIG. 4) is modified as shown in FIG. 5. The LO signal fed to the mixer 46a, 46b is different than the conventional mixer (shown in FIGS. 1 and 2). Thus, the use of this polyphase approach as provided by the embodiments herein achieves an efficient I and Q signal splitting without substantially any noise penalty. Now the current signal can be seen as split into four identical load impedances, Z, at the output of the mixer 46a, 46b. This equivalent RF signal splitting could be achieved by using two series switches as shown in FIG. 5. For improved RF performance, the synthesis of the LO signal is better achieved in the LO path. Using combinational logic, the required 25% duty cycle LO signal can be easily synthesized.

Additional advantages to the dramatic reduction in current consumption afforded by the embodiments herein include much less I and Q mismatch compared to the conventional circuits since most of the mismatch in the conventional approaches comes from the RF I and Q buffer stages. However, this mismatch is eliminated using the embodiments herein. The linearity of the passive mixer 46a, 46b doubles (increases by approximately 6dB) since the voltage swing across the switch decreases by half. In other words, the gain of the mixer 46a, 46b can increase by double without any penalty on linearity. This translates to a more relaxed noise figure (NF) on the subsequent analog baseband filter.

The embodiments herein can also apply to RF mixer design constructed in different technologies than CMOS such as bipolar complementary metal oxide semiconductor (BICMOS), silicon germanium (SiGe), bipolar, and gallium arsenide (GaAs) technologies. Furthermore, the embodiments herein can also be used for different applications other than wireless receivers in order to obtain highly linear mixers.

FIG. 8, with reference to FIGS. 3(A) through 7, is a flow diagram illustrating a method of downconverting a RF signal according to an embodiment herein, wherein the method comprises providing (101) a received RF signal to a transconductance amplifier 42, 43; filtering (103) the RF signal using a passive mixer 46a, 46b operatively connected to the transconductance amplifier 42, 43; and downconverting (105) the RF signal using a load impedance 47 (Z) operatively connected to the passive mixer 46a, 46b. The method may further comprise configuring the load impedance Z with a parallel combination of a FDNR component 60, a capacitor 57, 58, and a resistor 55, 56. The method may further comprise configuring the load impedance Z with a pair of complex poles, a pair of imaginary zeros, and a real pole. Preferably, the FDNR 60 comprises a GIC. The voltages at an input and an output of the passive mixer 46a, 46b are preferably related such that the input voltage of the passive mixer 46a, 46b is an upconverted version of the output voltage of the passive mixer 46a, 46b, wherein the input voltage of the passive mixer 46a, 46b is preferably at an output of the transconductance amplifier 42, 43. The method may further comprise configuring the load impedance Z with a pair of operational amplifiers 61, 62; and at least one capacitance 66, 76 adapted to reduce noise generated by the pair of operational amplifiers 61, 62.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments can be used in the design/implementation of any receiver (for example, wireless, TV tuner, modems). The embodiments provide a technique to achieve low current highly linear CMOS downconverting mixers for RF receivers.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. An electrical circuit for downconverting a radio frequency (RF) signal, said electrical circuit comprising:
    at least one transconductance amplifier;
    a coupling capacitance coupled to said at least one transconductance amplifier;
    a passive mixer operatively connected to said coupling capacitance, said passive mixer being adapted for current domain mixing of electrical current transferred from said coupling capacitance; and
    a pair of second-order complex load impedances operatively connected to said passive mixer.

2. The electrical circuit of claim 1, wherein said pair of second-order complex load impedances comprise a parallel combination of a frequency dependent negative resistance (FDNR) component, a capacitor, and a resistor.

3. The electrical circuit of claim 2, wherein said FDNR approximates a third order elliptic filter response.

4. The electrical circuit of claim 1, wherein said pair of second-order complex load impedances comprise a pair of complex poles, a pair of imaginary zeros, and a real pole.

5. The electrical circuit of claim 1, wherein voltages at an input and an output of said passive mixer are related such that the input voltage of said passive mixer is an upconverted version of the output voltage of said passive mixer.

6. The electrical circuit of claim 5, wherein said coupling capacitance performs an impedance inversion on said radio frequency signal and transforms an inductance to a capacitance.

7. The electrical circuit of claim 1, wherein said transconductance amplifier feeds a signal in a cuffent domain to said passive mixer.

8. A radio frequency (RF) system for downconverting a RF signal, said RF system comprising:
    an antenna adapted to receive an RF signal;
    a transconductance amplifier operatively connected to said antenna, said transconductance amplifier being adapted to amplify said RF signal;
    a coupling capacitance coupled to said transconductance amplifier;
    a passive mixer operatively connected to said coupling capacitance, said passive mixer being adapted for current domain mixing of electrical current transferred from said coupling capacitance; and
    a load impedance operatively connected to said passive mixer.

9. The RF system of claim 8, wherein said load impedance comprises a parallel combination of a frequency dependent negative resistance (FDNR) component, a capacitor, and a resistor.

10. The RF system of claim 9, wherein said FDNR approximates a third order elliptic filter response.

11. The RF system of claim 8, wherein said load impedance comprises a pair of complex poles, a pair of imaginary zeros, and a real pole.

12. The RF system of claim 8, wherein voltages at an input and an output of said passive mixer are related such that the input voltage of said passive mixer is an upconverted version of the output voltage of said passive mixer.

13. The RF system of claim 12, wherein said coupling capacitance performs an impedance inversion on said radio frequency signal and transforms an inductance to a capacitance.

14. The RF system of claim 8, wherein said transconductance amplifier feeds a signal in a current domain to said passive mixer.

15. A method of downconverting a radio frequency (RF) signal, said method comprising:
    providing a received RF signal to a transconductance amplifier;
    receiving said RF signal from a coupling capacitance coupled to said transconductance amplifier;
    filtering said RF signal using a passive mixer operatively connected to said coupling capacitance; and
    downconverting said RF signal using a load impedance operatively connected to said passive mixer.

16. The method of claim 15, further comprising configuring said load impedance with a parallel combination of a frequency dependent negative resistance (FDNR) component, a capacitor, and a resistor.

17. The method of claim 16, wherein said FDNR approximates a third order elliptic filter response.

18. The method of claim 15, further comprising configuring said load impedance with a pair of complex poles, a pair of imaginary zeros, and a real pole.

19. The method of claim 15, wherein voltages at an input and an output of said passive mixer are related such that the input voltage of said passive mixer is an upconverted version of the output voltage of said passive mixer.

20. The method of claim 19, wherein said coupling capacitance performs an impedance inversion on said radio frequency signal and transforms an inductance to a capacitance.

21. The method of claim 15, wherein said transconductance amplifier feeds a signal in a current domain to said passive mixer.

* * * * *